United States Patent
Nakano et al.

[11] Patent Number: 6,028,353
[45] Date of Patent: Feb. 22, 2000

[54] CHIP BEAD ELEMENT AND MANUFACTURING METHOD THEREOF

[75] Inventors: Atsuyuki Nakano, Sakaemachi; Akinori Oi, Narita; Takuya Aoki, Shimofusamachi; Minoru Takaya, Tokyo, all of Japan

[73] Assignee: TDK Corporation, Tokyo, Japan

[21] Appl. No.: 09/132,512

[22] Filed: Aug. 11, 1998

[30] Foreign Application Priority Data

Nov. 21, 1997 [JP] Japan ..................................... 9-320661

[51] Int. Cl.[7] .......................... H01L 23/053; H01L 23/12; H03H 7/00
[52] U.S. Cl. ............................ 257/701; 257/702; 333/174
[58] Field of Search ..................................... 257/701, 422, 257/702, 428; 333/174

[56] References Cited

U.S. PATENT DOCUMENTS

| | | |
|---|---|---|
| 4,146,854 | 3/1979 | Ishino et al. . |
| 4,297,661 | 10/1981 | Stegens . |
| 4,301,428 | 11/1981 | Mayer . |
| 4,322,698 | 3/1982 | Takahashi et al. . |
| 4,717,901 | 1/1988 | Autenrieth et al. ........................ 336/83 |
| 5,191,699 | 3/1993 | Ganslmeier et al. ................... 29/602.1 |
| 5,748,065 | 5/1998 | Hashimoto et al. ...................... 336/96 |

FOREIGN PATENT DOCUMENTS

| | | |
|---|---|---|
| 57-39521 | 8/1982 | Japan . |
| 4-127701 | 4/1992 | Japan . |
| 8-78218 | 3/1996 | Japan . |

OTHER PUBLICATIONS

P.Schiffres, "Dissipative Coaxial RFI Filter", IEEE Transactions on Electromagnetic Compatibility, EMC–6, (1964), pp. 55–61.

H.M. Schlicke, et al., "Compatible EMI Filters", IEEE Spectrum, Oct. 1967, pp. 59–68.

J. H. Bogar, et al., "Miniature Low–Pass EMI Filters", Proceedings of the IEEE, vol. 67, No. 1, Jan. 1979, pp. 159–163.

*Primary Examiner*—Mahshid Saadat
*Assistant Examiner*—Jhihan B. Clark
*Attorney, Agent, or Firm*—Oblon, Spivak, McClelland, Maier & Neustadt, P.C.

[57] ABSTRACT

The present invention relates to a laminated chip bead element demonstrating noise absorption characteristics over a broad range in a high frequency range of GHz or higher. An insulating body is constituted of a material achieved by mixing ferrite powder and an insulating resin. At least one signal conductor is embedded in the insulating body. It is desirable that the insulating body includes a plurality of composite members.

10 Claims, 18 Drawing Sheets

CHIP BEAD ELEMENT AND MANUFACTURING METHOD THEREOF

BACKGROUND OF THE INVENTION

1. Field of the Invention

The present invention relates to a chip bead element employed in electronic circuits, and more specifically it relates to a chip bead element that demonstrates noise absorption characteristics over a broad range at a high frequency in the GHz band.

2. Discussion of Background

As electronic devices become ever thinner and smaller, circuit patterning on the internal board has come to be designed to achieve a higher density and electronic components that are to be mounted are now mounted at an extremely high density. In addition, with higher frequencies and digitalization achieved for signals in recent years, noise increasingly occurs inside electronic devices. This results in erroneous operation of the electronic device itself and erroneous operation of an external electronic device caused by noise leaking from the device.

In such an electronic device, a great number of components, such as chip capacitors, ferrite beads, EMI filters or the like, are employed as countermeasures against noise. Among these noise blocking components, ferrite chip bead elements are employed as countermeasures against noise in a great number of electronic devices since they are inexpensive and easy to use.

An ideal ferrite chip bead element should be capable of allowing necessary signals to pass while not allowing any unwanted signals (may be referred to as noise) present in the higher frequency range to pass, and it is required to demonstrate signal absorption characteristics over a broad frequency range.

However, since the electromagnetic characteristics of the ferrite material used in ferrite chip bead elements normally demonstrate dependency on the frequency, it is difficult to achieve broad-band signal absorption characteristics. In addition, since, theoretically, a spinel type ferrite bead obtained through sintering does not demonstrate magnetism in the GHz frequency range, they are not suited for use in high frequency ranges.

As a noise blocking component that may be employed in the high frequency ranges, an absorption-type low pass filter has already been proposed. One example of such an absorption-type low pass filter is constituted by using ferrite and is widely employed as a laminated noise blocking component.

This laminated noise blocking component, which achieves a structure realized by embedding a signal conductor inside a magnetic layer constituted of ferrite, is constituted by laminating paste containing ferrite and paste or metal foil containing a conductor by employing printing technology or a thick film sheet lamination method.

Since Ag or an Ag alloy is used to constitute the signal conductor, a well known example of this laminated noise blocking component uses magnetic layers constituted of NiCuZn ferrite or the like that can be sintered at a relatively low temperature.

However, since an NiCuZn ferrite material, which achieves a dielectric constant of approximately 10 to 15, is not suited for use in a high frequency range, since the floating capacity between the patterns of the signal conductor is large and, therefore, the self-resonant frequency cannot be increased.

There are other magnetic materials such as Mn -group ferrites that are materials achieving high magnetic permeability and planar group ferrites suited for use in a high frequency range. However, they all need to be sintered at a high temperature, requiring control of the baking atmosphere and, therefore, they are not suited to be baked at the same time with the metal that is used to constitute the signal conductor.

Furthermore, the impedance peak value of a laminated noise blocking component achieved in the form of a ferrite chip bead element is only 700 to 800 MHz even when a material having a low magnetic permeability ($\mu$) is used, proving that it is not suited for noise absorption in the GHz frequency range.

In addition, while the impedance value may be increased by increasing the number of turns in the signal conductor or by using a material having a high magnetic permeability ($\mu$), the laminated noise blocking component is still not suited for absorbing noise in the high frequency range, since the impedance peak value shifts toward a lower frequency range.

U.S. Pat. No. 4,297,661 discloses a low pass filter to be employed in a high frequency range, in which the microstrip is constituted of ferrite. This filter is achieved by taking advantage of the phenomenon in which the absorption effect manifests in the low frequency range and disappears in the high frequency range, but is still not capable of inhibiting unwanted signal components present in the high frequency range of GHz or higher through absorption.

While Schiffres proposes a coaxial transmission line employing ferrite in IEEE Transactions on Electromagnetic Compatibility page 55 to 61, 1964, the object of this coaxial transmission line is acquisition of characteristics mainly in the MHz band and the transmission characteristics and the reflection characteristics in the frequency range of GHz or higher are not disclosed. It is assumed that transmission occurs in the transmission line in the high frequency range of GHz or higher.

An attempt to effect signal removal through absorption in the high frequency range by combining a non-magnetic material having an absorption effect in the high frequency range and ferrite, too, has been reported on.

The EMI filter proposed by Schlicke in IEEE Spectrum page 59 to 68, 1967 and the pass EMI filter effective in the low frequency range proposed by Bogar in Proceedings of the IEEE vol. 67 page 159 to 163, 1979 are examples of this attempt. In each of these filters in the prior art, a portion of the insulator in the coaxial filter is constituted by laminating ferrite and a dielectric substance. In U.S. Pat. No. 4,146,854, a blocking element that employs a wave absorber constituted of a composite material of ferrite beads, resin and metal or the like is disclosed, and in Japanese Unexamined Patent Publication No. 127701/1992, a technology that employs a wave absorbing substance in a portion of a non-magnetic microstrip line is disclosed.

However, in either case, the wave absorber or the wave absorbing substance is merely used in an auxiliary manner for the purpose of keeping down the high frequency components of the signal that cannot be absorbed.

Furthermore, U.S. Pat. No. 4,301,428 discloses an electrical wire, a cable or the like containing a metallic magnetism absorbing mixture to function as a conductive element having an appropriate degree of electrical resistance. This conductive element has a compound structure achieved by covering a non conductive core constituted of fiber, resin or glass with a thin conductive metal layer.

However, providing electrical resistance at a signal line would prove problematic in applications in which micro signals are handled, since it would not only remove the noise component but also result in blocking of the signal component. In addition, this prior art publication only discloses an electrical wire and does not mention any functions to be fulfilled as a circuit element.

Japanese Unexamined Patent Publication No. 78218/1996 discloses a chip bead element to support high frequencies that is constituted by providing a signal line electrode inside an insulating body constituted of a composite material achieved by mixing a ferromagnetic metal powder and an insulating resin and providing a ground electrode at a front surface of the insulating body.

While this chip bead element achieves high pass characteristics and low pass characteristics, whereby the high frequency component of 1 GHz or higher can be absorbed, its frequency blocking characteristics in the high frequency range become steep, since the chip bead element uses ferromagnetic metal powder. Thus, it is not suited for increasing the frequency blocking range.

The electromagnetic characteristics of ferrite materials and compound ferrite materials demonstrate frequency dependence, and resonance occurs as the frequency increases. Then, the magnetic permeability ($\mu$) becomes drastically reduced when the frequency exceeds a given level. This limits frequencies that can be used.

In order to achieve effectiveness over a broader frequency range, an element achieved by providing beads having varying frequency blocking characteristics in series may be employed.

However, there is a problem with the wound-type line in that the element becomes large. In addition, while the structure achieved by baking circuits constituted of different ferrite materials having different frequency characteristics that have been simultaneously laminated in series may be conceived for a laminated type element, problems such as cracking, peeling and warping occur in the element constituted by laminating two or more different ferrite materials and baking them at the same time, due to the varying coefficients of linear thermal expansion and the varying contraction behavior of the materials.

Normally, when simultaneously baking a laminated body constituted by laminating different materials, if the difference between the coefficients of linear thermal expansion between the two materials reaches or exceeds $15 \times 10^{-7}/°$ C., cracks occur inside the laminated chip bead element.

In addition, even when the difference between the coefficients of linear thermal expansion is less than $15 \times 10^{-7}/°$ C., it is difficult to achieve electrical and magnetic characteristics as designed, due to stress applied to the ferrite which results in degradation in the magnetic characteristics.

Furthermore, when simultaneously baking different materials, since the compositions of the materials used are different, a reaction occurs at the layer interface, which causes copper oxide or the like to become deposited at the layer interface to greatly reduce the inherent resistance of the element.

Moreover, when simultaneously baking different materials to constitute a laminated chip bead element, only NiCuZn ferrite that can be sintered at a low temperature can be used as the ferrite material. Thus, the operating frequencies become limited and only a narrow band can be supported.

SUMMARY OF THE INVENTION

It is an object of the present invention to provide a chip bead element that can be used at high frequencies equal to or exceeding GHz and demonstrates noise absorption characteristics over a broad range.

It is a further object of the present invention to provide a chip bead element having a simple structure.

In order to achieve the objects described above, the chip bead element according to the present invention includes an insulating body and at least one signal conductor. The insulating body is constituted of a composite material achieved by mixing ferrite powder and an insulating resin. The signal conductor is embedded inside the insulating body.

In the chip bead element according to the present invention, since the insulating body is constituted of a composite material achieved by mixing ferrite powder and an insulating resin, unwanted high frequency components in the high frequency range which are contained in a frequency signal passing through the signal conductor can be absorbed through the absorbing effect of the insulating body with a high degree of reliability. In more specific terms, a chip bead element manifests an absorption effect in a high frequency range of 1 GHz or higher (high frequency blocking) and allows a signal belonging in a lower frequency range to pass (low pass) is achieved. Thus, the chip bead element according to the present invention can be employed as a low pass filter.

While the magnetic permeability is reduced as the frequency becomes higher in the composite material used in the present invention, the dielectric constant, too, becomes reduced at the same time which will contribute to a reduction in the impedance change so that, ultimately, reflection is reduced. Thus, a chip bead element that is capable of achieving a low pass filter which manifests a high frequency blocking effect through absorption in the high frequency range, while keeping down reflection can be obtained.

Furthermore, unlike the prior art technology disclosed in Japanese Unexamined Patent Publication No. 78218/1996 that employs ferromagnetic metal powder, the present invention employs ferrite powder to expand the frequency blocking range by utilizing the residual loss in the ferrite powder to advantage. Ferrite powder, which is a polycrystalline substance, generates a residual loss over a broader frequency range compared to ferromagnetic metal powder. According to the present invention, which effectively utilizes these characteristics of ferrite powder, wider high frequency blocking characteristics can be achieved compared to the prior art technology disclosed in Japanese Unexamined Patent Publication No. 78218/1996 that employs ferromagnetic metal powder.

Since the insulating body that absorbs the high frequency component is constituted of a composite material achieved by mixing ferrite powder and an insulating resin and the signal conductor is embedded inside the insulating body, a high degree of simplification is achieved in the structure.

In one desirable mode of the chip bead element according to the present invention, the insulating body has a structure achieved by laminating a plurality of compound members. More desirably, at least one of the plurality of compound members demonstrates electromagnetic characteristics that are different from those of the other compound members. By adopting this structure, a chip bead element that demonstrates noise absorption characteristics over an even broader range can be realized compared to a chip bead element having an insulating body constituted of a single composite material, by utilizing the frequency characteristics of the compound member having different electromagnetic characteristics to advantage.

Moreover, the chip bead element according to the present invention, which employs a compound material achieved by mixing ferrite powder and an insulating resin, can be formed through heat hardening or reaction hardening, unlike a sintered body. Thus, even when a plurality of compound members are laminated to constitute the insulating body, the element is completely free of problems that would occur when different ceramic materials are laminated and sintered, such as cracking, warping, peeling and copper oxide being deposited at the layer interface. Thus, an arbitrary number of compound members having different electromagnetic characteristics can be freely combined to assure specific characteristics that are required.

The present invention discloses desirable examples of the ferrite powder and the insulating resin and desirable compositional ratios they should achieve. In addition, the present invention discloses desirable shapes, patterns and the like for the signal conductor. Moreover, the present invention discloses a method for manufacturing a chip bead element as well.

DETAILED DESCRIPTION OF THE PREFERRED EMBODIMENTS

Figure 1:
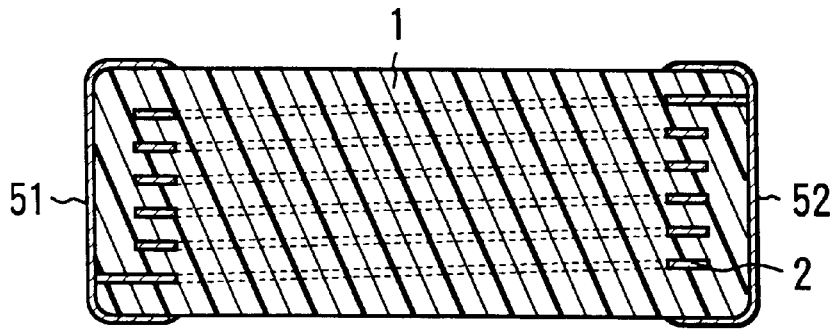
FIG. 1 is a sectional view of the chip bead element according to the present invention.
Figure 2:
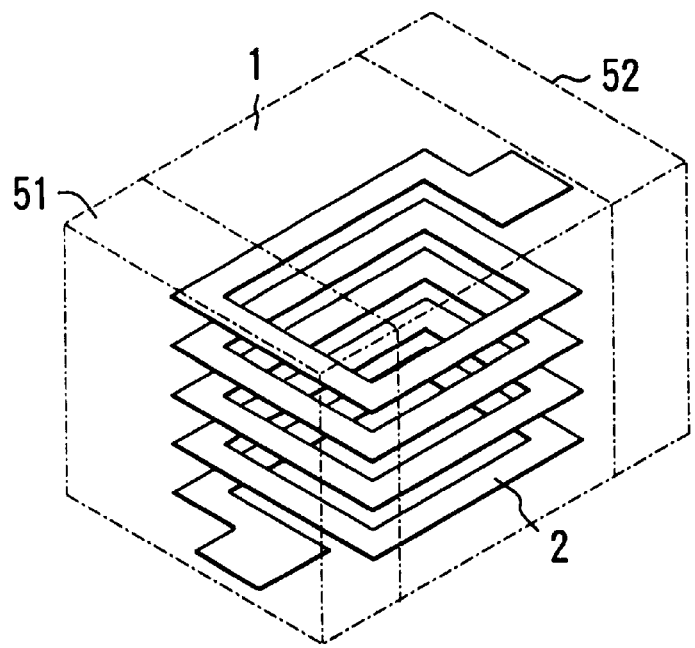
FIG. 2 is a perspective, particularly illustrating the signal conductor included in the chip bead element illustrated in FIG. 1.

In reference to FIGS. 1 and 2, the chip bead element according to the present invention includes an insulating body 1 and at least one signal conductor 2. The insulating body 1 is constituted of a compound material achieved by mixing ferrite powder and an insulating resin. In the embodiment, the signal conductor 2 is embedded in a spiral form inside the insulating body 1.

The insulating body 1 is provided with a pair of terminal electrodes 51 and 52 for external connection at two ends facing opposite each other. Thus, the chip bead element can be employed as a surface-mounting chip component. The signal conductor 2 is wound to advance with intervals in a direction perpendicular to the direction in which the terminal conductors 51 and 52 are provided. The two ends of the signal conductor 2 are respectively connected to the terminal electrodes 51 and 52.

Since the insulating body is constituted of a composite material achieved by mixing ferrite powder and an insulating resin, unwanted high frequency components in the high frequency range which are contained in a frequency signal passing through the signal conductor 2 can be absorbed through the absorbing effect of the insulating body 1 with a high degree of reliability. In more specific terms, a chip bead element that manifests an absorption effect in a high frequency range of 1 GHz or higher (high frequency blocking) and allows a signal belonging in a lower frequency range to pass (low pass) is achieved. Thus, the chip bead element according to the present invention is suited for application as a low pass filter.

This chip bead element, which contains ferrite powder, achieves broad high frequency blocking characteristics. As a result, a chip bead element having a broader frequency blocking range compared to a chip bead element using ferromagnetic metal powder is obtained.

Furthermore, since the insulating body 1 that absorbs the high frequency component is constituted of a composite material achieved by mixing ferrite powder and an insulating resin and the signal conductor 2 is embedded inside the insulating body 1 in a spiral form, a high degree of simplification is achieved in the structure.

The chip bead element according to the present invention utilizes the residual loss of the ferrite material and the low dielectric constant achieved by the organic insulating resin. The mechanism with which low pass and high frequency blocking are achieved in the chip bead element according to the present invention is described below.

The reflection gain S11 ($\omega$) and the transmission gain S21 ($\omega$) in a transmission path are expressed in the equations below with the reflectance and the transmissivity of the element assigned as $\Gamma$ and T respectively.

$$S11(\omega)=(1-T^2)\Gamma/(1-T^2\Gamma^2)$$

$$S21(\omega)=(1-\Gamma^2)T/(1-T^2\Gamma^2)$$

$$\Gamma=\{(\mu_{eff}/\epsilon_{eff})^{1/2}-Zo\}/\{(\mu_{eff}/\epsilon_{eff})^{1/2}+Zo\}$$

$$T=\exp\{-i\omega(\epsilon_{eff}\mu_{eff})^{1/2}x\}$$

In these equations, $\epsilon_{eff}$ represents the complex effective dielectric constant of the material and $\mu_{eff}$ represents the complex effective magnetic permeability of the material. The complex effective dielectric constant $\epsilon_{eff}$ and the complex effective magnetic permeability $\mu_{eff}$ are actually calculated by adding into consideration the shape factors to the complex dielectric constant and the complex magnetic permeability of the material. Zo indicates the characteristic impedance of the circuit.

First, in order to effect absorption in the high frequency range, the transmissivity T must be close to 0. This requirement is satisfied when ($\epsilon_{eff}$, $\mu_{eff}$) are imaginary numbers or negative real numbers. In other words, the degree of absorption in the transmission path increases when an imaginary number component is present in either or both $\epsilon_{eff}$ or $\mu_{eff}$ and as the value becomes greater. This means that when these conditions are met, the loss angle (tan $\delta$) of the material increases at high frequencies.

In addition, in order to reduce reflection over the entire frequency range (in order to reduce S11), the reflectance $\Gamma$ must be close to 0. Thus, $(\mu_{eff}/\epsilon_{eff})^{1/2}$ needs to approach the characteristic impedance Zo throughout the entire frequency range.

The compound mat employed in the present invention achieves prominent absorption starting from approximately 1 GHz and it still achieves absorption at 20 GHz or higher accompanied by dielectric absorption as well.

Generally speaking, the real number components of the dielectric constant $\epsilon$ and the magnetic permeability $\mu$ become reduced in proportion to the frequency in the range where absorption occurs. Thus, when absorption is effected, the characteristic impedance Zo of the chip bead element changes together with the frequency, and, as a result, the reflectance $\Gamma$ becomes higher resulting in prominent reflection.

While the magnetic permeability is reduced as the frequency becomes higher in the composite material used in the present invention, the dielectric constant, too, becomes reduced at the same time which will contribute to a reduction in the impedance change so that, ultimately, reflection is reduced. Thus, a chip bead element that is capable of achieving a low pass filter which manifests a high frequency blocking effect through absorption in the high frequency range, while keeping down reflection can be obtained.

While no specific requirements are imposed in regard to the type of insulating resin to be mixed with the ferrite powder, it has been confirmed that desirable characteristics are achieved when an epoxy group resin, a phenol group resin, a rubber group resin, an acrylic group resin or a Teflon group resin is used. One of these insulating resins may be used by itself or they may be used in combination. By employing these resins, a product can be manufactured at a low temperature within the range of 100 to 200° C. instead of at high temperature (approximately 900° C.) required in the prior art, so that the insulating body 1 can be manufactured with ease without having to conform to the restrictions imposed upon the baking temperature and the baking atmosphere.

Various types of material may be used to constitute the ferrite powder included in the insulating body 1. Ferrite materials such as NiCuZn, MnZn, MnMgZn and NiZn are examples of such materials. It is desirable to add the insulating resin within a range of 5 to 90 weight parts relative to the weight of the ferrite powder.

By varying the ferrite powder content within this range, $\mu$ and $\epsilon$ of the insulating body 1 can be changed freely to facilitate design of high frequency noise absorption characteristics.

When the content of the insulating resin relative to the ferrite powder exceeds 90 weight parts, a sufficient degree of blocking cannot be achieved. In addition, when the content of the insulating resin relative to the ferrite powder is less than 5 weight parts, it becomes difficult to consistently mix the resin with the ferrite powder, which results in a reduced strength in the component and drastic degradation in the insulation resistance between the electrodes.

The chip bead element illustrated in FIGS. 1 and 2 may be achieved by laminating a coating material or a thick film sheet constituted by mixing the ferrite powder and the insulating resin and a conductive paste or a metal foil by employing printing technology or thick film sheet lamination method or the like. As a result, outstanding mass productivity is achieved.

Figure 3:
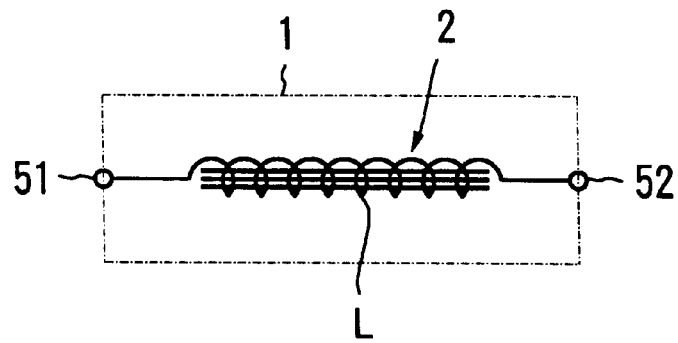
FIG. 3 is an electrically equivalent circuit diagram of the chip bead element illustrated in FIGS. 1 and 2.

FIG. 3 is an electrically equivalent circuit diagram of the chip bead element according to the present invention. As illustrated in FIG. 3, the chip bead element illustrated in FIGS. 1 and 2, achieves an equivalent circuit constituted by inserting a line inductance L generated by the signal conductor 2 between the terminals 51 and 52.

Since the magnetic loss of the chip bead element represented by the circuit in FIG. 3 is in proportion to the line inductance L, the loss increases in the frequency range over which the line impedance L is equal to or greater than the output impedance of the drive circuit (not shown), demonstrating characteristics equivalent to those of a low pass filter. However, unlike a low pass filter constituted of a normal low loss circuit element, it absorbs the signal energy within the element and does not allow the signal energy to be reflected in the blocking band. Thus, by embedding the signal conductor 2 inside the insulating body 1 containing ferrite powder with a small particle size, a chip bead element that demonstrates a large magnetic loss and absorbs unwanted frequency components over a broad frequency range is realized.

Next, Table I presents the impedance peak values achieved by Examples for Comparison 1 and 2 and Embodiments 1 to 6 obtained by varying the composition of the insulating body 1, and corresponding frequencies. In Examples for Comparison 1 and 2, the signal conductor is embedded inside the ferrite.

TABLE I

| No. | composition filler (mol%) | | | | phenol resin (parts) | impedance peak frequency (MHz) | |Z| (Ω) |
|---|---|---|---|---|---|---|---|
| | $Fe_2O_3$ | NiO | CuO | ZnO | | | |
| Example for comparison 1 | 48 | 45 | 5 | 2 | no | 736 | 254 |
| Example for comparison 2 | 44 | 48 | 6 | 2 | no | 683 | 201 |
| Embodiment 1 | 49 | 17 | 8 | 26 | 10 | 1,990 | 146 |
| Embodiment 2 | 49 | 17 | 8 | 26 | 15 | 2,150 | 152 |
| Embodiment 3 | 49 | 17 | 8 | 26 | 30 | 2,150 | 188 |
| Embodiment 4 | 49.5 | 7 | 12 | 31.5 | 60 | 1,680 | 229 |
| Embodiment 5 | 49 | 17 | 8 | 26 | 60 | 2,450 | 276 |
| Embodiment 6 | 44 | 48 | 6 | 2 | 60 | 3,120 | 189 |

As the results presented in Table I indicate, while an impedance peak manifests at approximately 700 MHz in Examples for Comparison 1 and 2 each using an insulating body containing only NiCuZn ferrite with no resin content, impedance peaks manifest in the high frequency range of 1 GHz or higher in Embodiments 1 to 6 each employing an insulating body constituted of a compound of NiCuZn ferrite and resin.

Figure 4:
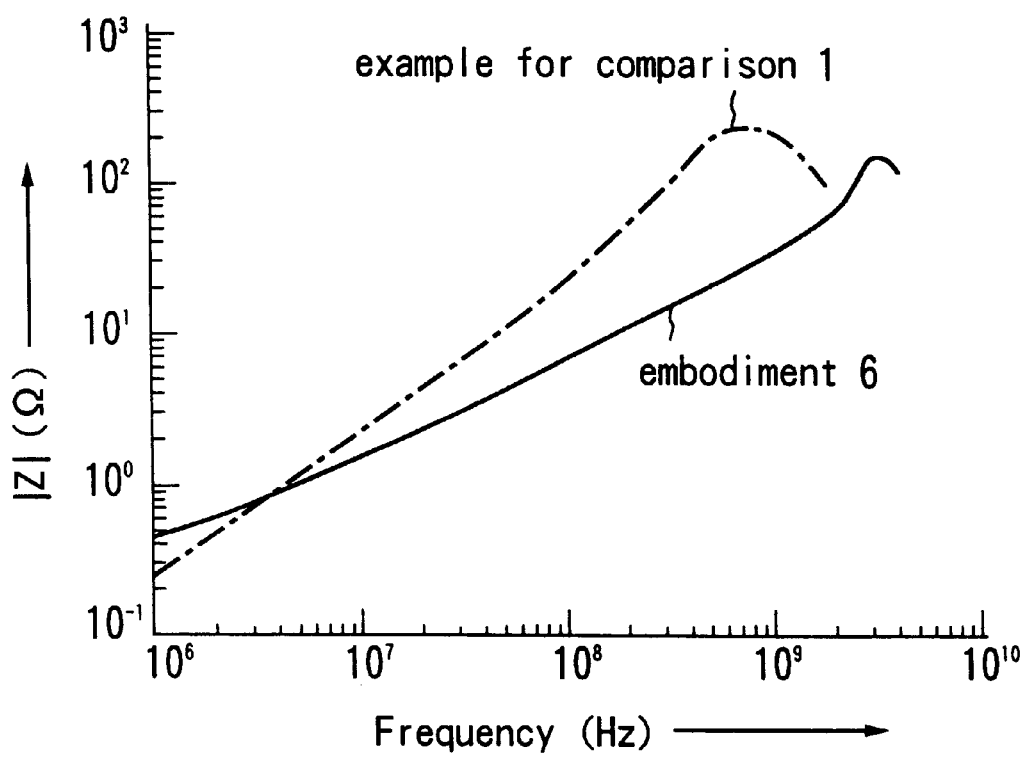
FIG. 4 presents a comparison between the electromagnetic characteristics of Example for Comparison 1 and Embodiment 6 of the present invention.

FIG. 4 presents a comparison of the electromagnetic characteristics of Example for Comparison 1 and embodiment 6. As FIG. 4 illustrates, Example for Comparison 1 demonstrates characteristics whereby the impedance peak manifests at a frequency of approximately 700 MHz, whereas embodiment 6 demonstrates characteristics whereby an impedance peak occurs at a frequency of approximately 3 GHz. These results prove that the resin ferrite compound material has a higher frequency blocking range than the ferrite sintered body.

Figure 5:
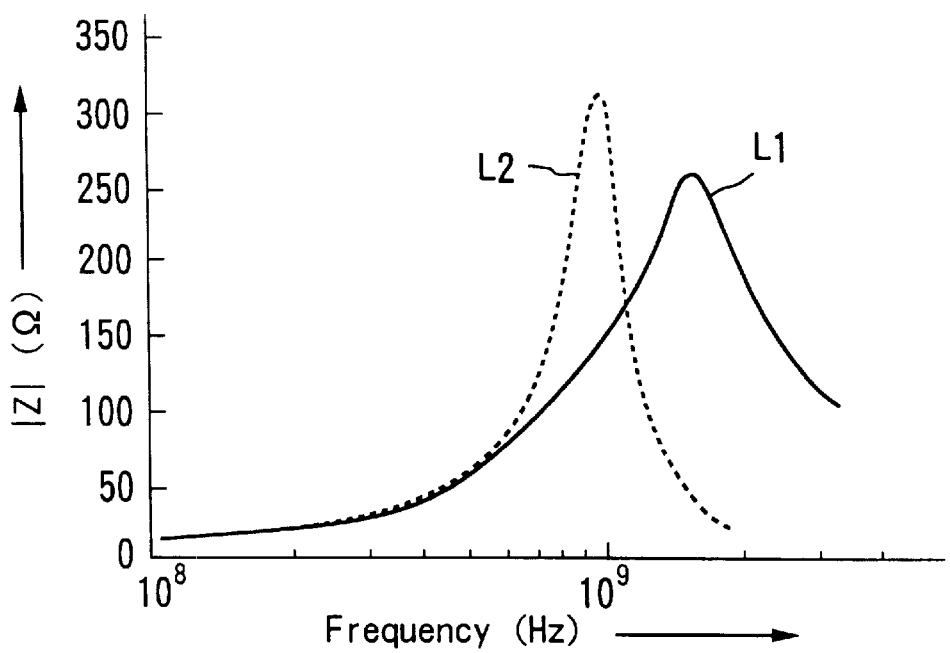
FIG. 5 presents a comparison between the electromagnetic characteristics of carbonyl iron that constitutes magnetic metal powder and ferrite.

FIG. 5 presents a comparison of electromagnetic characteristics L2 achieved by a chip bead element manufactured by using carbonyl iron constituting magnetic metal powder and electromagnetic characteristics achieved by a chip bead element manufactured by using an NiCuZn ferrite. In FIG. 5, the horizontal axis represents the frequency and the vertical axis represents the impedance value |Z|. FIG. 5 indicates that noise can be cut over a broader frequency range by using the ferrite material than by using the magnetic metal powder. This means that the chip bead element according to the present invention using ferrite powder utilizes the residual loss of the ferrite powder to advantage to expand the frequency blocking range, unlike the prior art technology disclosed in Japanese Unexamined Patent Publication No. 78218/1996 which utilizes ferromagnetic metal powder. Ferrite powder, which is a polycrystalline substance manifests a residual loss over a broader frequency range compared to ferromagnetic metal powder. The present invention effectively utilizes these characteristics that ferrite powder has.

Furthermore, since selection can be made from a wide range of ferrite group materials and a wide range of ferrite compositions to constitute the ferrite powder compared to magnetic metal powder such as carbonyl iron, an advantage is achieved in that a wide range of magnetic characteristics can be designed to fulfill specific purposes.

Moreover, when a composite material achieved by mixing magnetic metal powder (carbonyl iron) and a resin is used (Japanese Unexamined Patent Publication No. 78218/1996), the surface of the carbonyl iron must undergo an oxidizing treatment to form a high resistance film in order to assure an insulating property. In contrast, since such a pre-treatment is not required in the present invention which uses ferrite, the length of the manufacturing process can be reduced.

Figure 6:
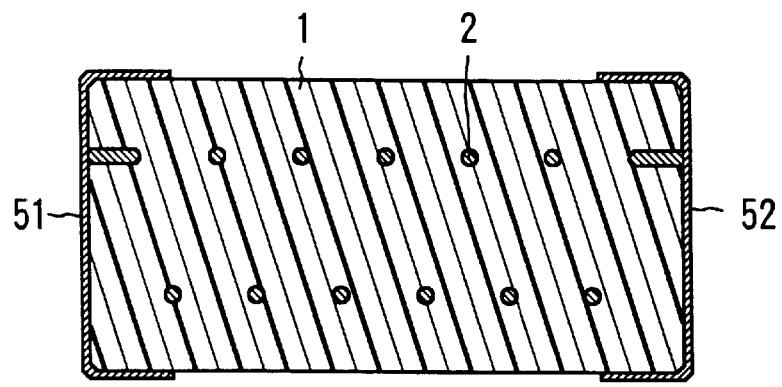
FIG. 6 is a sectional view of another embodiment of the chip bead element according to the present invention

FIG. 6 is a sectional view of another embodiment of the chip bead element according to the present invention. In the figure, the same reference numbers are assigned to components that are identical to those in FIGS. 1 and 2 to preclude the necessity for a detailed explanation thereof. In the chip bead element in FIG. 6, the signal conductor 2 is embedded inside the insulating body 1 turning in the direction in which the terminal conductors 51 and 52 are provided. As has already been explained, the insulating body 1 is constituted of a compound material constituted by mixing ferrite powder and an insulating resin.

Figure 7:
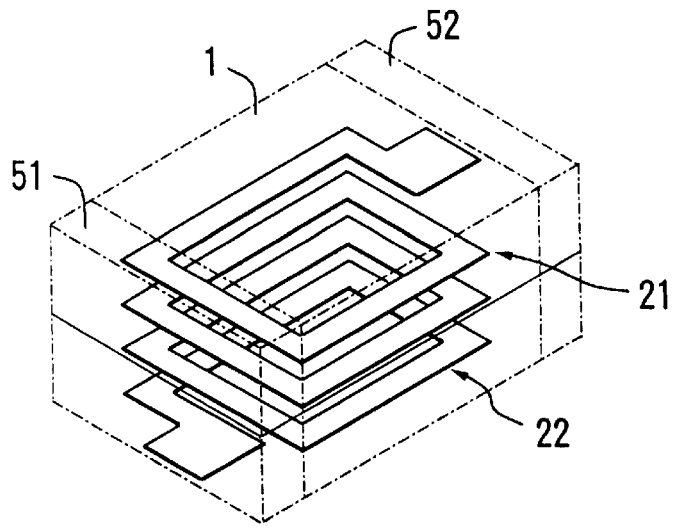
FIG. 7 is a perspective, particularly illustrating the signal conductor included in yet another embodiment of the present invention.
Figure 8:
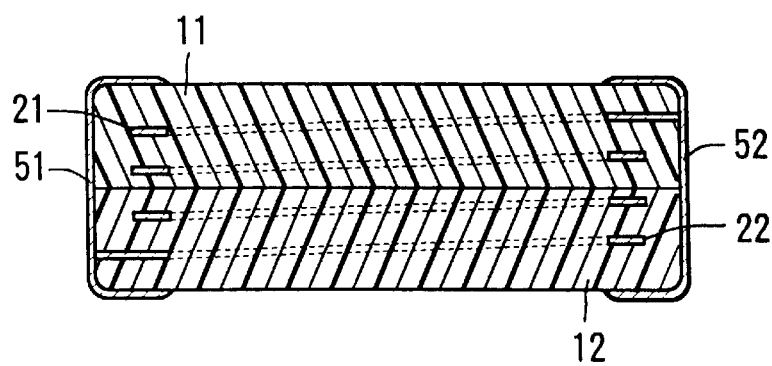
FIG. 8 is a sectional view of the chip bead element illustrated in FIG. 7.

FIG. 7 is a perspective particularly illustrating the signal conductors included in the chip bead element according to the present invention and FIG. 8 is a sectional view of the chip bead element. In the figures, the same reference numbers are assigned to components identical to those illustrated in FIGS. 1 and 2. The chip bead element illustrated in FIGS. 7 and 8 includes an insulating body 1 constituted of a plurality of compound members 11 and 12, signal conductors 21 and 22 and terminal electrodes 51 and 52 for taking out signals to the outside.

The compound members 11 and 12 are each constituted by mixing ferrite powder and an insulating resin and hardening the mixture. The signal conductors 21 and 22 are embedded in a spiral form inside the compound members 11 and 12 respectively. The pair of terminal electrodes 51 and 52 for signal take-out are provided at the two ends of the insulating body 1 that face opposite each other. Thus, this chip bead element can be used as a surface mounting chip component.

The signal conductors 21 and 22 are wound to advance in the direction that is perpendicular to the terminal electrodes 51 and 52. The tubes of each of the signal conductors 21 and 22 are connected to the pair of parallel electrodes 51 and 52 respectively. The number of the compound members 11 and 12 may be selected freely. It is desirable that at least one of the plurality of compound members 11 and 12 demonstrate electromagnetic characteristics that are different from those of the other compound members. Even more desirable, different electromagnetic characteristics should be given to each of the plurality of compound members 11 and 12.

Through this structure, a chip bead element that achieves noise absorption characteristics over an even broader range compared to a chip bead element having an insulating body 1 constituted of a single composite material (see FIGS. 1 to 3) is realized by utilizing the frequency characteristics of the plurality of compound members 11 and 12 having different electromagnetic characteristics to advantage.

Furthermore, the chip bead element in the embodiment, which uses the compound members 11 and 12 each achieved by mixing ferrite powder and an insulating resin, can be formed through heat hardening or reaction hardening, unlike a sintered body. Thus, the chip bead element in the embodiment is completely free of problems that would occur when laminating and sintering different ceramic materials such as cracking, warping, peeling, copper oxide becoming deposited at the layer interface and the like.

Since a product can be obtained at a temperature within the range of 100 to 200° C. with the resin used in the present invention becoming hardened within this temperature range, it is not necessary to perform baking at a high temperature (approximately 900° C.) or control the baking atmosphere, as is required in the prior art. Consequently, the insulating body 1 constituted by laminating the plurality of compound members 11 and 12 can be manufactured with ease.

Desirable types of ferrite powder and insulating resin for the compound members 11 and 12 and their desirable contents have already been explained.

Figure 9:
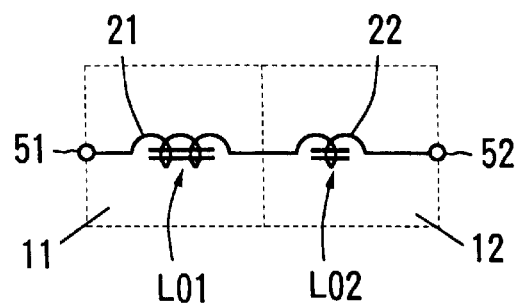
FIG. 9 is an electrically equivalent circuit diagram of the chip bead element illustrated in FIGS. 7 and 8.

FIG. 9 is an electrically equivalent circuit diagram of the chip bead element shown in FIGS. 7 and 8. As illustrated in FIG. 9, the chip bead element illustrated in FIGS. 7 and 8, achieves an equivalent circuit constituted by inserting a line inductance LO1 generated by the signal conductor 21 and a line inductance L02 generated by the signal conductor 22 between the terminals 51 and 52.

Figure 10:
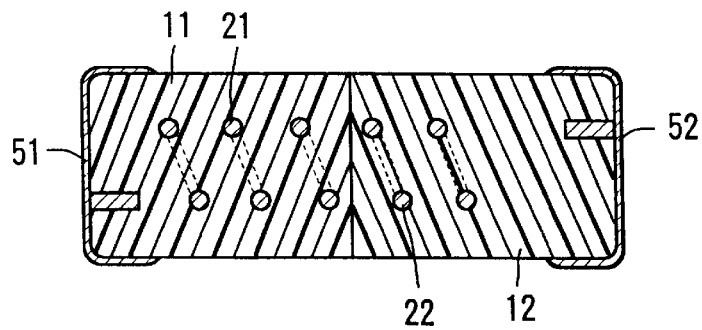
FIG. 10 is a sectional view of yet another embodiment of the chip bead element according to the present invention.

FIG. 10 is a sectional view illustrating another embodiment of the chip bead element according to the present invention. In the chip bead element illustrated in the FIG. 10, the signal conductors 21 and 22 are embedded inside the insulating body constituted of the compound members 11 and 12 by turning in the direction in which the terminal conductors 51 and 52 are provided.

The chip bead element according to the present invention may be manufactured by adopting the printing lamination method or the thick film sheet lamination method. When the printing nomination method is employed, printing of a coating material containing ferrite powder and resin and printing a conductive paste are repeated to manufacture a laminated body. Then, the laminated body undergoes a heat treatment and then the laminated body is cut. External terminal electrodes are constituted by applying a conductor paste to the end surfaces facing opposite each other at which the signal conductors of the element that has been taken out through cutting are exposed and by plating the surfaces.

FIGS. 11 to 25 illustrate the steps included in the printing lamination method. First, the ferrite powder and the insulating resin are measured to have them ready in specific quantities. The ferrite powder and the insulating resin that have been thus measured are mixed using a 3-piece roll, a kneader or a mixer to prepare a ferrite coating material. Then, using the ferrite coating material thus achieved, a thick film sheet is formed through coating or extrusion.

Figure 11:
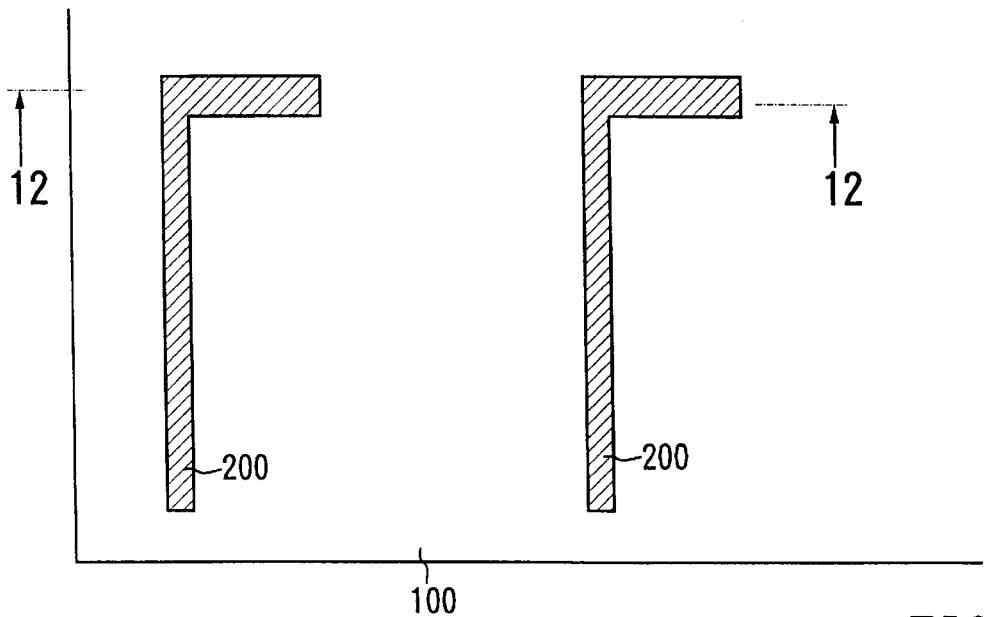
FIG. 11 illustrates a manufacturing step included in the printing lamination method employed to manufacture the chip bead element according to the present invention.
Figure 12:
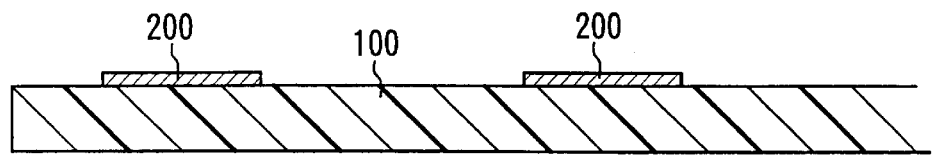
FIG. 12 is a sectional view taken along line 12—12 of FIG. 11.

Next, as illustrated in FIGS. 11 and 12, a conductor paste is applied through printing onto one surface of the thick film sheet 100 that has been obtained to form a signal conductor pattern 200. The figures illustrate an example in which a number of signal conductor patterns 200 are formed on the one surface of a single thick film sheet 100 at once.

Figure 13:
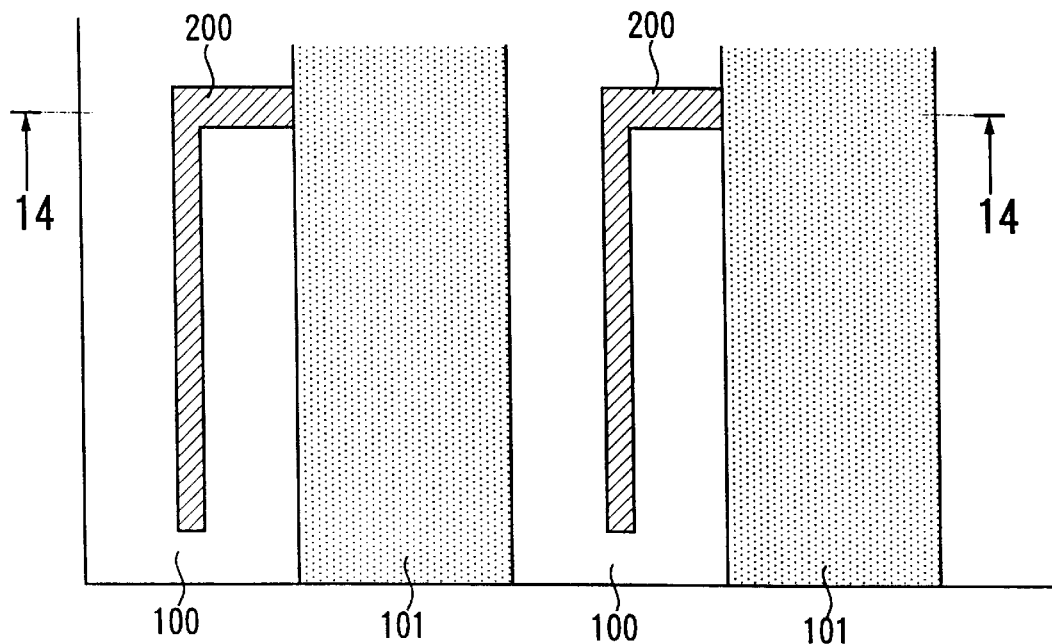
FIG. 13 illustrates the manufacturing step implemented after the step illustrated in FIGS. 11 and 12.
Figure 14:
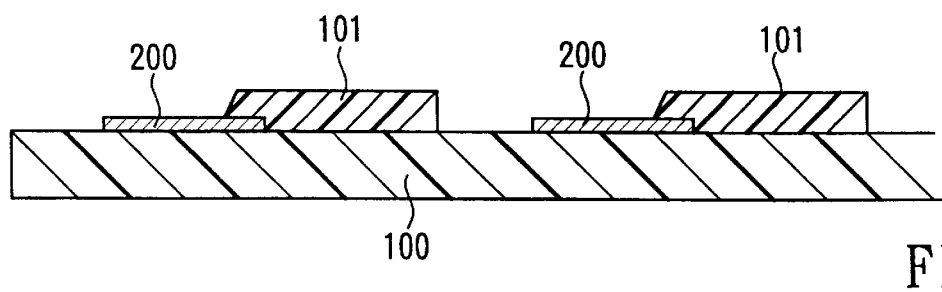
FIG. 14 is a sectional view taken along line 14—14 of FIG. 13.

Next, as illustrated in FIGS. 13 and 14, a ferrite coating material prepared in a similar manner is applied through printing to cover a portion of each signal conductor pattern 200 to form ferrite coating material layers 101.

Figure 15:
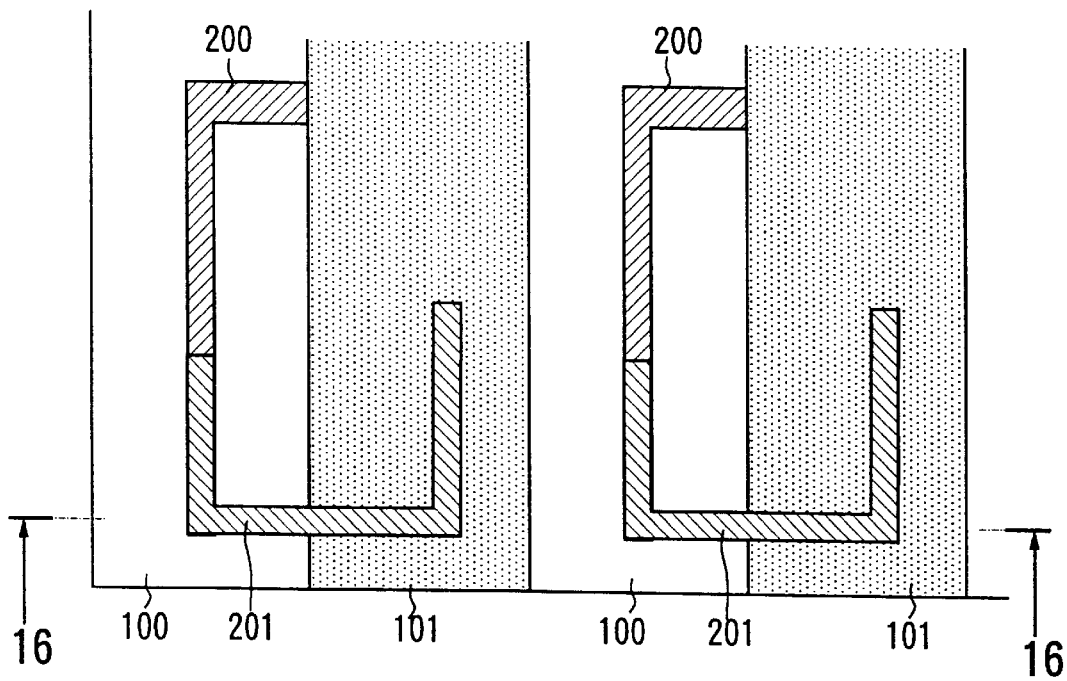
FIG. 15 illustrates the manufacturing step implemented after the step illustrated in FIGS. 13 and 14.
Figure 16:
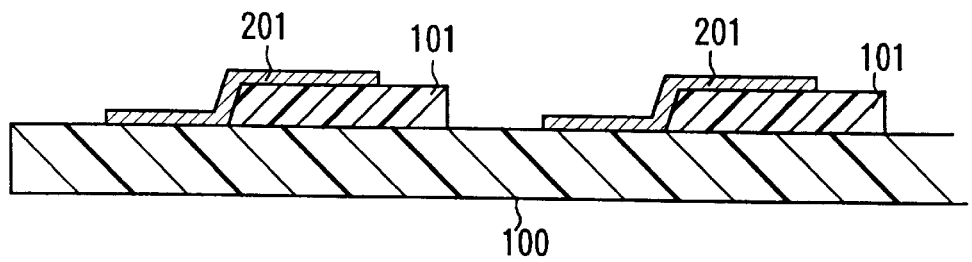
FIG. 16 is a sectional view taken along line 16—16 of FIG. 15.

After this, as illustrated in FIGS. 15 and 16, a signal conductor pattern 201 corresponding to half a turn is formed through printing on the surface of the thick film sheet 100 and over each ferrite coating material layer 101. One end of each signal conductor pattern 201 is made continuous to one end of a signal conductor pattern 200.

Figure 17:
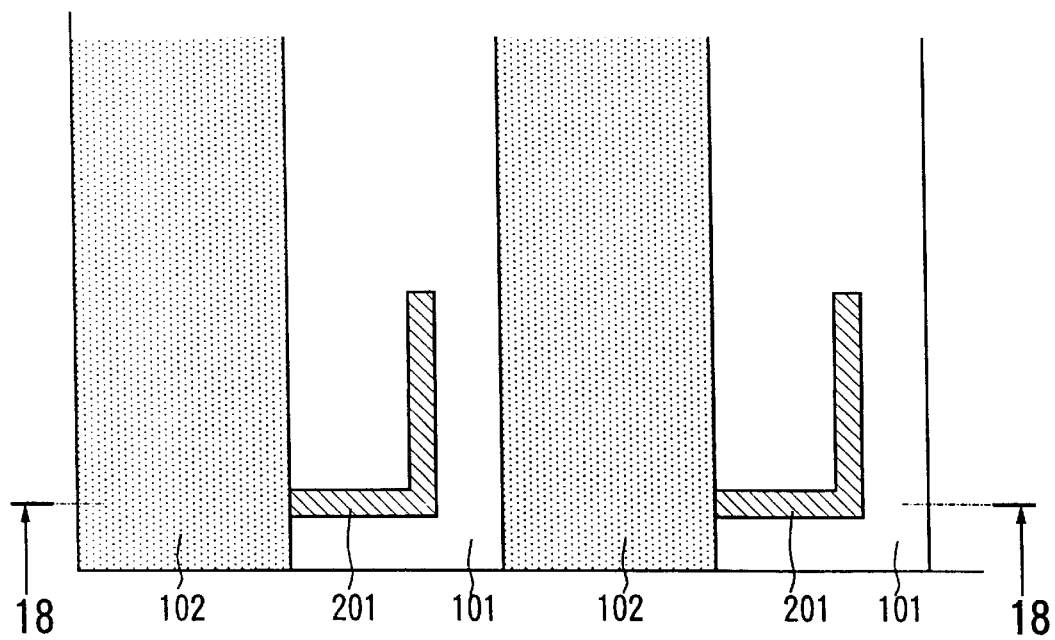
FIG. 17 illustrates the manufacturing step implemented after the step illustrated in FIGS. 15 and 16.
Figure 18:
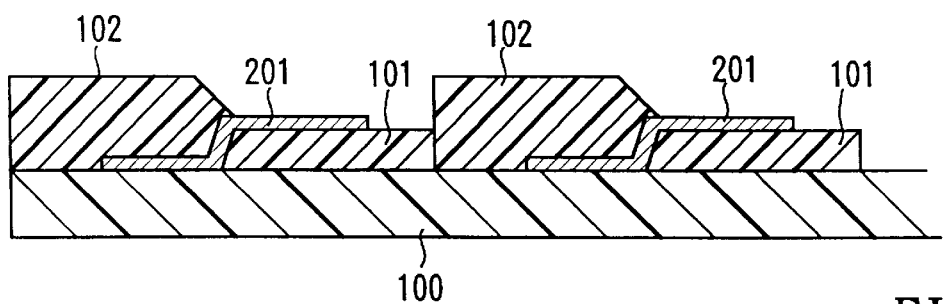
FIG. 18 is a sectional view taken along line 18—18 of FIG. 17.

Next, as illustrated in FIGS. 17 and 18, another ferrite coating material layer 102 is printed on the surface of the thick film sheet 101. The signal conductor patterns 200 (see FIG. 15) formed at the surface of the thick film sheet 100 are thus covered by the ferrite coating material layers 102.

Figure 19:
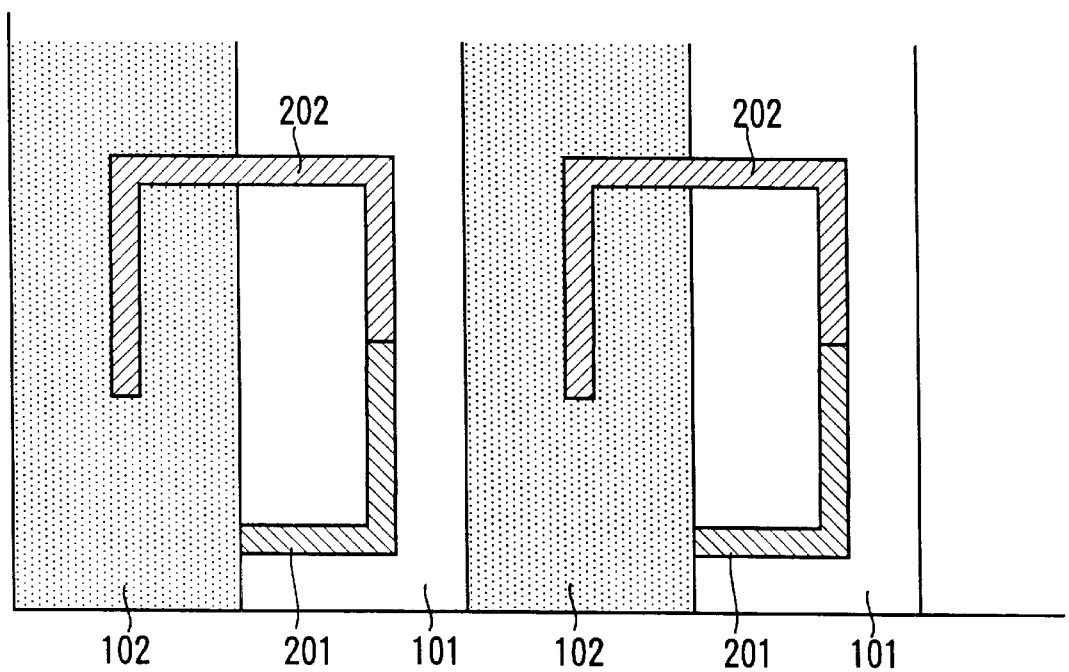
FIG. 19 illustrates the manufacturing step implemented after the step illustrated in FIGS. 17 and 18

Then, as illustrated in FIG. 19, a signal conductor pattern 202 corresponding to half a turn is formed through printing at the surface of each ferrite coating material layer 101 and the adjacent ferrite coating material layer 102. One end of the signal conductor pattern 202 is made continuous to one end of the corresponding signal conductor pattern 201. The steps described above are repeated as illustrated in FIGS. 20 to 23 to manufacture a printed laminated body containing signal conductors having a specific number of turns.

Figure 20:
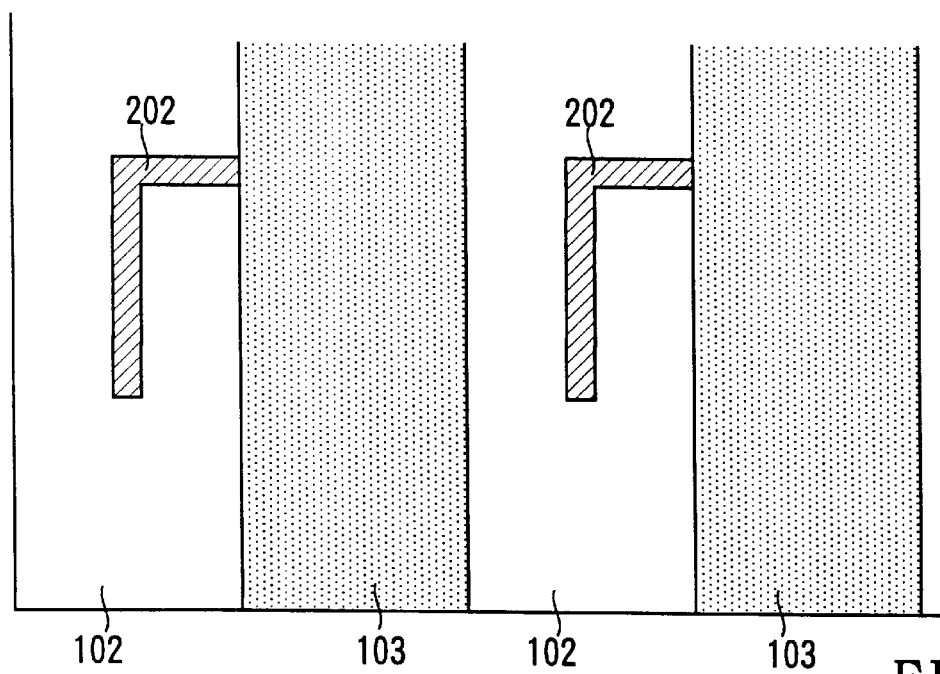
FIG. 20 illustrates the manufacturing step implemented after the step illustrated in FIG. 19.

In the step illustrated in FIG. 20, another ferrite coating material layer 103 is printed at the surface of each ferrite coating material layer 101 adjacent to a corresponding ferrite coating material layer 102. The signal conductor patterns 201 and 202 formed at the surface of each ferrite coating material layer 101 are thus covered by the ferrite coating material layer 103.

Figure 21:
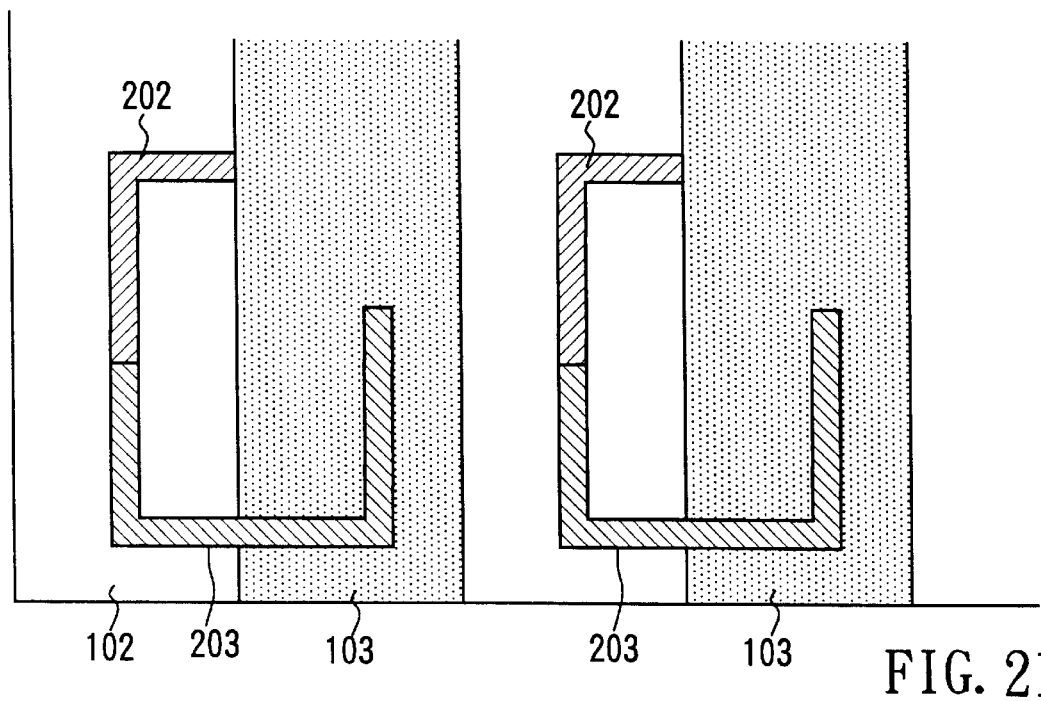
FIG. 21 illustrates the manufacturing step implemented after the step illustrated in FIG. 20.

In the process illustrated in FIG. 21, a signal conductor pattern 203 corresponding to half a turn is formed through printing at the surface of each ferrite coating material layer 102 and over the adjacent ferrite coating material layer 103. One end of the signal conductor pattern 203 is made continuous to one end of the corresponding signal conductor pattern 202.

Figure 22:
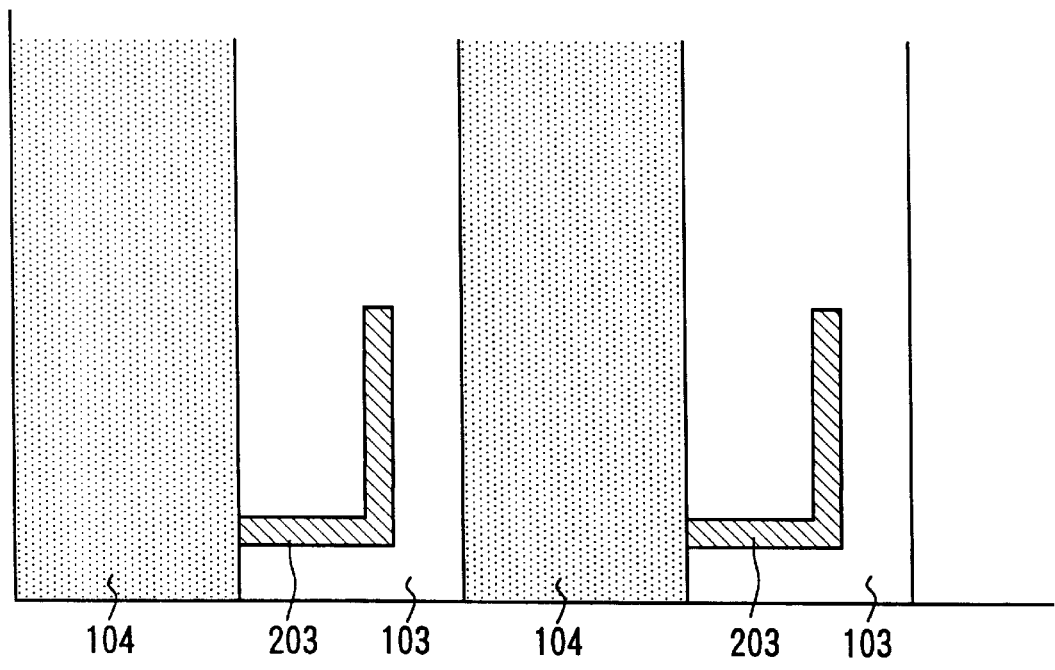
FIG. 22 illustrates the manufacturing step implemented after the step illustrated in FIG. 21.

In the step illustrated in FIG. 22, another ferrite coating material layer 104 is printed at the surface of each ferrite coating material layer 102 adjacent to the corresponding ferrite coating material layer 103. The signal conductor patterns 202 and 203 formed at the surface of each ferrite coating material layer 104 are thus covered by the ferrite coating material layer 104.

Figure 23:
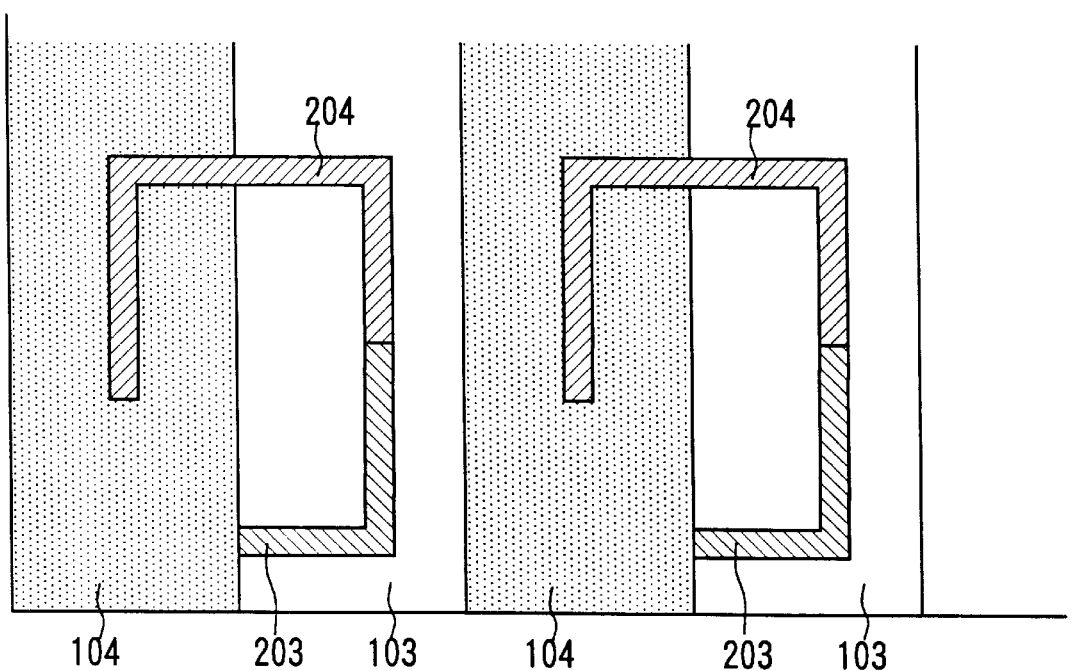
FIG. 23 illustrates the manufacturing step implemented after the step illustrated in FIG. 22.

In the step illustrated in FIG. 23, a signal conductor pattern 204 corresponding to half a turn is formed through printing at the surface of each ferrite coating material layer 103 and over the adjacent ferrite coating material layer 104. One end of the signal conductor pattern 204 is made continuous to one end of the corresponding signal conductor pattern 203. The steps illustrated in FIGS. 20 to 23 are repeated for the required number of times.

Figure 24:
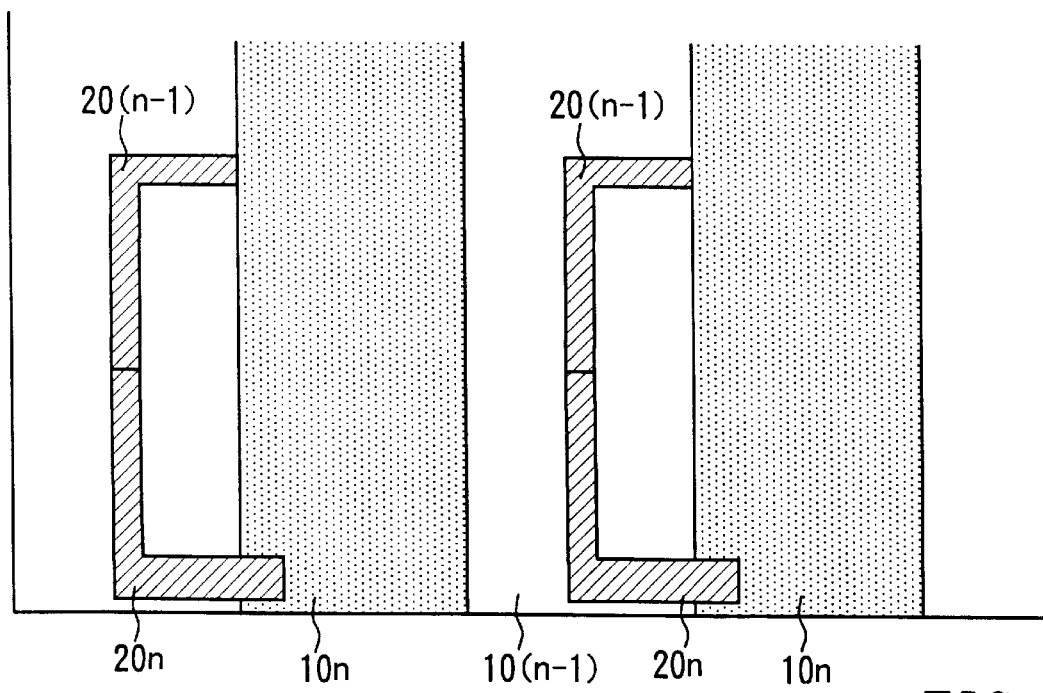
FIG. 24 illustrates the manufacturing step implemented after the step illustrated in FIG. 23.

FIG. 24 illustrates the signal conductor patterns 20n at the final stage. Subsequently, another ferrite coating material layer (not shown) is applied to cover the signal patterns 20n.

In order to achieve a chip bead element having a plurality of compound members (see FIGS. 7 to 9) at least some of the ferrite coating material layers 201 to 20n should be constituted by using a different ferrite coating material.

Figure 25:
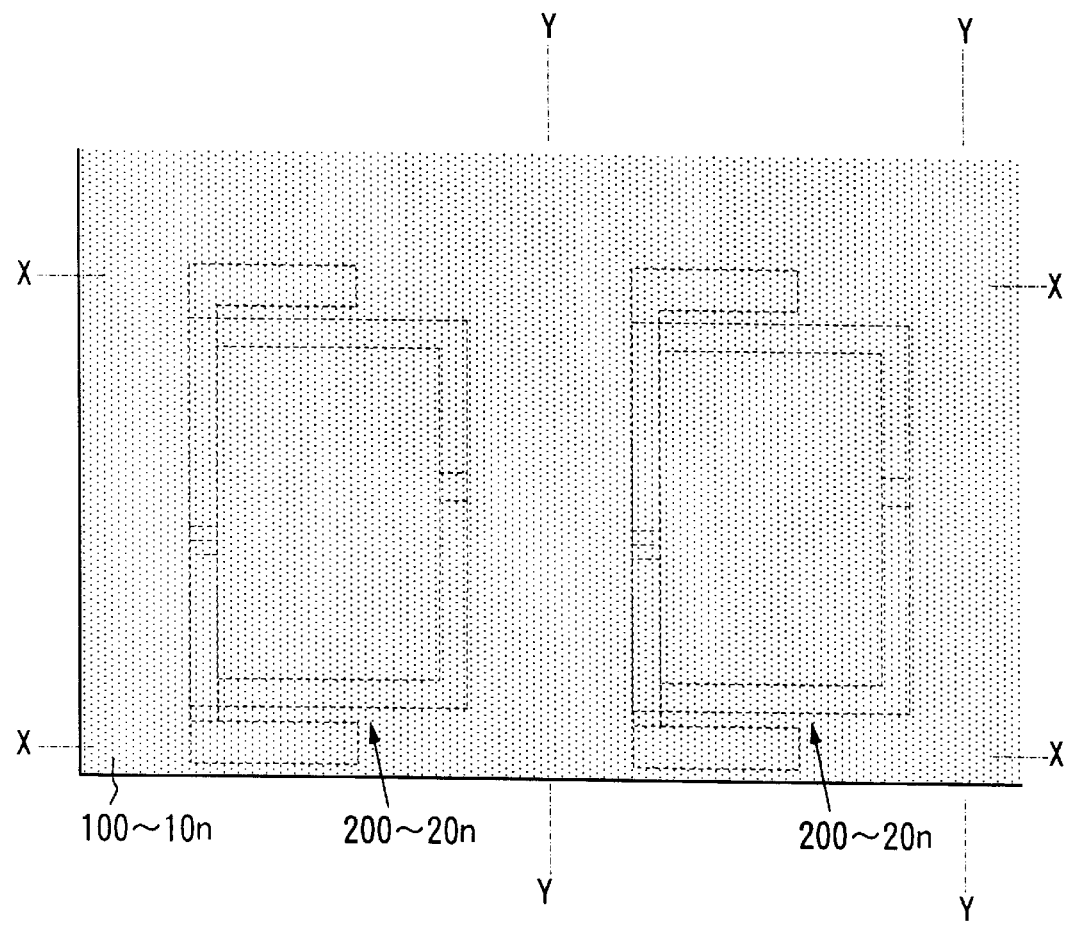
FIG. 25 illustrates a step for cutting the product obtained through the steps illustrated in FIGS. 11 to 24.

The printed laminated body obtained as described above is then caused to become hardened at a temperature ranging from 100 to 200° C., for instance. Then, as illustrated in FIG. 25, it is cut into pieces of a specific size along cutting lines X—X and Y—Y to constitute chip element assemblies. In each of the chip element assemblies, by applying a conductor paste to the end surfaces facing opposite each other at which the signal conductor is exposed and by plating the surfaces, external terminal electrodes are formed.

Now, in the manufacturing method employing the thick film sheet lamination method, a thick film sheet containing ferrite powder and an insulating resin is prepared. Next, conductors to constitute the signal conductors are formed on the thick film sheet. A plurality of thick film sheets, each having conductors formed to constitute the signal conductors are then laminated. The laminated body constituted of the thick film sheets is then crimped and heat treated. The laminated body thus achieved is then cut. A conductor paste is applied onto the end surfaces facing opposite each other where the signal conductor are exposed in the element taken out through the cutting process and their surfaces are plated to form external terminal electrodes.

FIGS. 26 to 36 illustrate the steps included in the thick film lamination method. First, the ferrite powder and the insulating resin are measured to have them ready in specific quantities. The ferrite powder and the insulating resin that have been thus measured are mixed using a 3-piece roll, a kneader or a mixer to prepare a ferrite coating material. Then, using the ferrite coating material thus achieved, a thick film sheet is formed through coating or extrusion.

Figure 26:
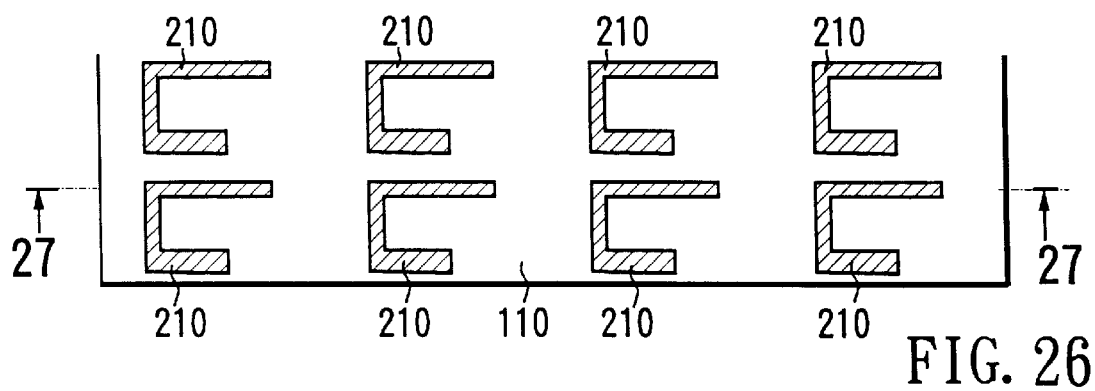
FIG. 26 illustrates the manufacturing step included in the thick film sheet lamination method adopted for manufacturing the chip bead element according to the present invention.
Figure 27:
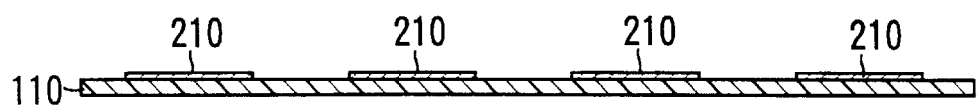
FIG. 27 is a sectional view taken along line 27—27 of FIG. 26.

Next, as illustrated in FIGS. 26 and 27, signal conductors 210 are formed on one surface of the thick film sheet 110 thus achieved by means such as a conductor paste application or metal foil bonding. The figures illustrate an example in which a great number of signal conductors 210 are formed at once on one surface of a single thick film sheet 110.

A plurality of thick film sheets are prepared as described above in correspondence to the pattern and the like of the signal conductors. While a total of 5 thick film shapes, i.e., a thick film sheet 120 illustrated in FIGS. 28 and 29, a thick film sheet 130 illustrated in FIGS. 30 and 31, a thick film sheet 140 illustrated in FIGS. 32 and 33 and a thick film sheet 150 illustrated in FIGS. 34 and 35 as well as the thick film sheet 110 illustrated in FIGS. 30 and 31 are provided in this embodiment, there may be more or fewer than 5 thick film sheet.

Figure 28:
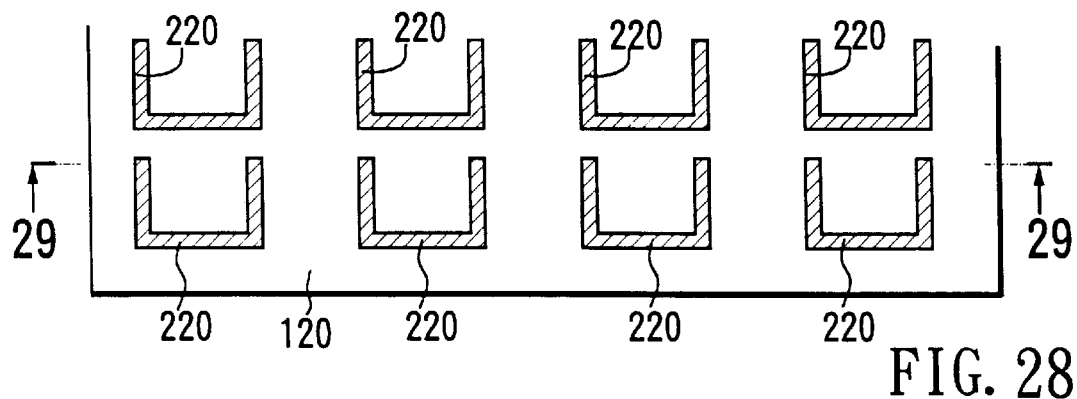
FIG. 28 illustrates another manufacturing step included in the thick film sheet lamination method adopted for manufacturing the chip bead element according to the present invention.
Figure 29:
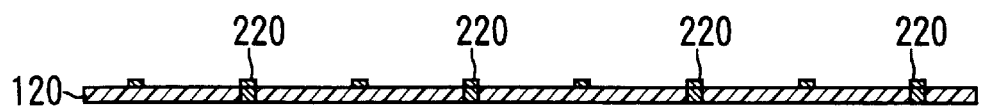
FIG. 29 is a sectional view taken along line 29—29 of FIG. 28.

The thick film sheet 120 in FIGS. 28 and 29 are provided with half-turn signal conductors 220 each having a pattern achieved by rotating the signal conductors 210 on the thick film sheet 110 by approximately 90°.

Figure 30:
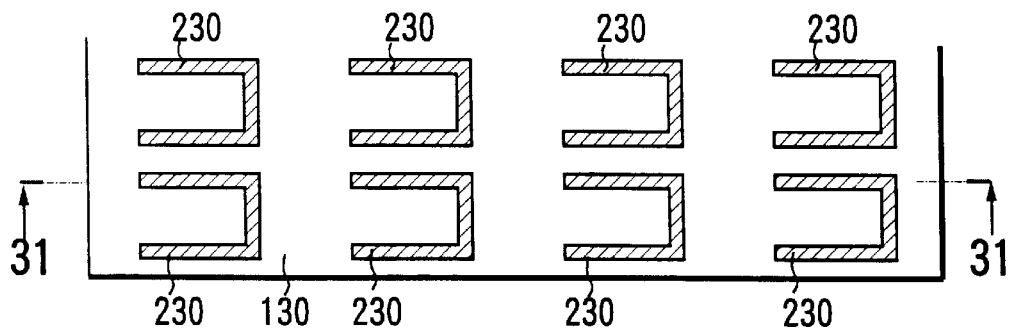
FIG. 30 illustrates yet another manufacturing step included in the thick film sheet lamination method adopted for manufacturing the chip bead element according to the present invention.
Figure 31:
FIG. 31 is a sectional view taken along line 31—31 of FIG. 30.

The thick film sheet 130 in FIGS. 30 and 31 are provided with half-turn signal conductors 230 each having a pattern achieved by rotating the signal conductors 220 on the thick film sheet 120 by approximately 90°.

Figure 32:
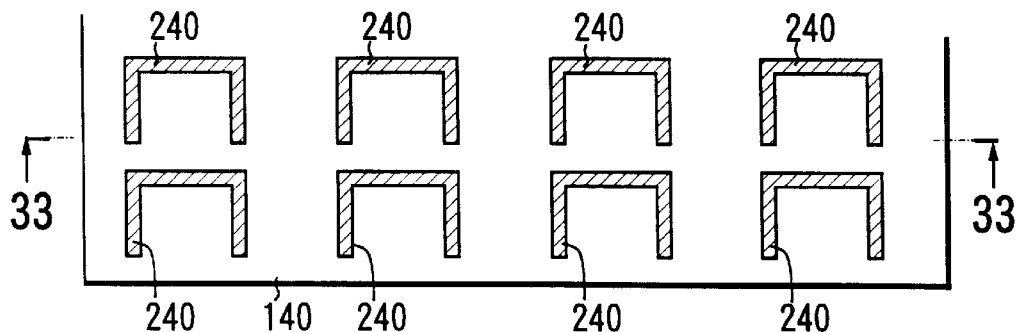
FIG. 32 illustrates yet another manufacturing step included in the thick film sheet lamination method adopted for manufacturing the chip bead element according to the present invention.
Figure 33:
FIG. 33 is a sectional view taken along line 33—33 of FIG. 32.

The thick film sheet 140 in FIGS. 32 and 33 are provided with half-turn signal conductors 240 each having a pattern achieved by rotating the signal conductors 230 on the thick film sheet 130 by approximately 90°.

Figure 34:
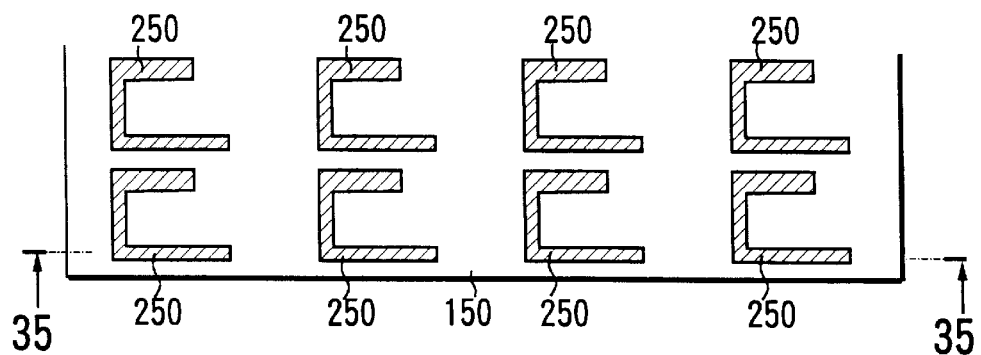
FIG. 34 illustrates yet another manufacturing step included in the thick film sheet lamination method adopted for manufacturing the chip bead element according to the present invention.
Figure 35:
FIG. 35 is a sectional view taken along line 35—35 of FIG. 34.

The thick film sheet 150 in FIGS. 34 and 35 are provided with half-turn signal conductors 250 each having a pattern achieved by rotating the signal conductors 240 on the thick film sheet 140 by approximately 90°.

Figure 36:
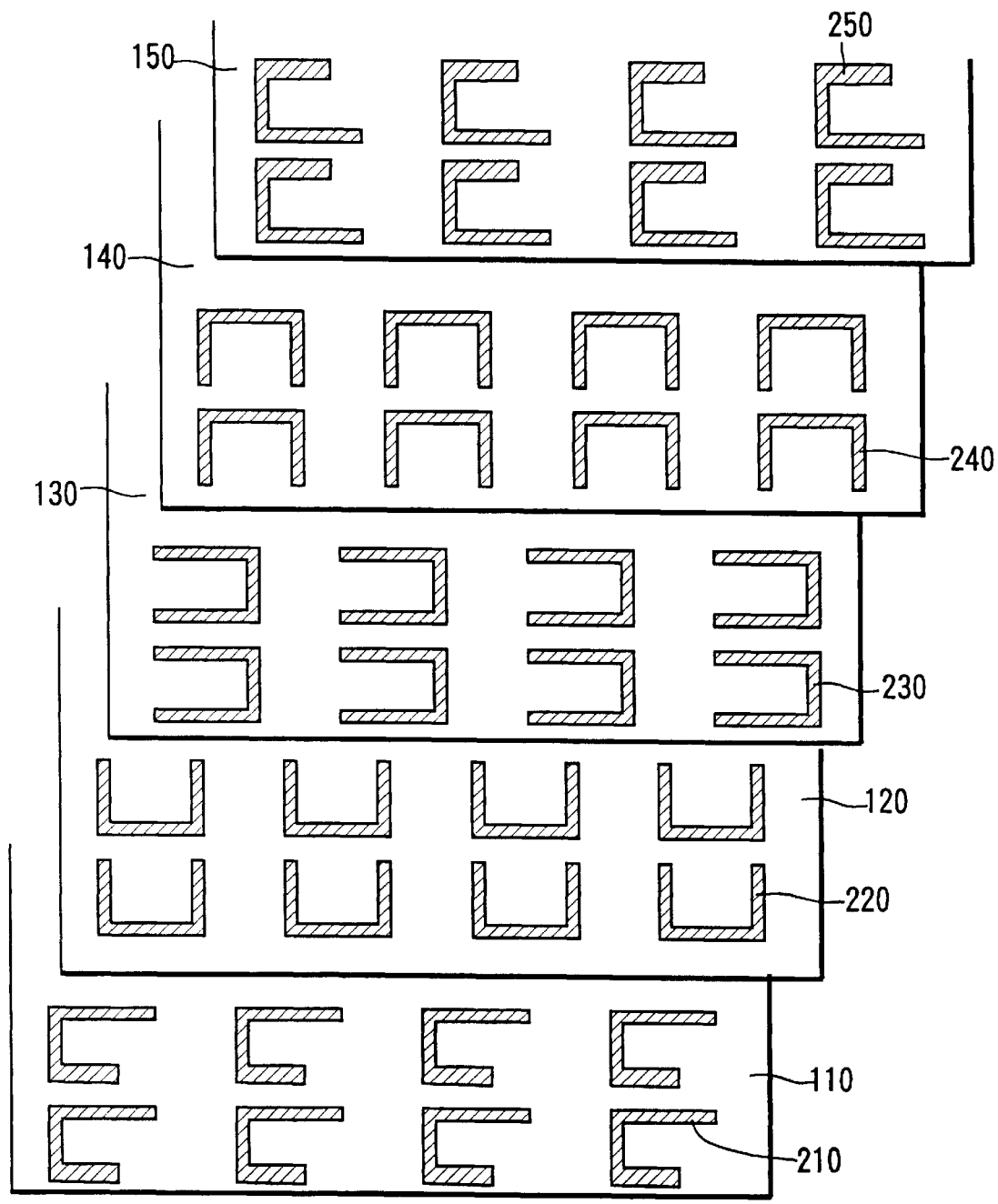
FIG. 36 illustrates a step during which the thick film sheets obtained through the steps illustrated in FIGS. 26 to 35 are laminated and crimped.

Next, as illustrated in FIG. 36, the thick film sheets 110 to 150 with the signal conductors 210 to 250 formed, are laminated over the required number of layers. Then, the laminated body constituted of the thick film sheets is crimped and is processed through a heat treatment before the laminated body is cut. External terminal electrodes are formed by applying a conductive paste to the end surfaces facing opposite each other at which the signal conductors are exposed in each element assembly and by plating the surfaces. The signal conductors 210 to 250 at the adjacent thick film sheets 110 to 150 are made to communicate with each other by through hole conductors or the like passing through the thick film sheets 110 to 150 in the direction of their thickness.

In order to achieve a chip bead element having a plurality of compound members (see FIGS. 7 to 9) at least one of the thick film sheets 110 to 150 should be constituted by using a different ferrite coating material.

Next, a specific manufacturing method and the impedance frequency characteristics achieved by a chip bead element manufactured through this method are explained.

Embodiment 11

10 weight parts of a phenol resin and 50 weight parts of butyl carbitol were added to 100 weight parts of NiCuZn ferrite powder having a magnetic permeability of 200 and a printing paste A was prepared by using a 3-piece roll. Likewise, 10 weight parts of the phenol resin and 50 weight parts of butyl carbitol were added to 100 weight parts of MnZn ferrite powder having a magnetic permeability of 5000 and a printing paste B was prepared by kneading the mixture with a 3-piece roll.

Next, 4 weight parts of ethyl cellulose and 30 weight parts of butyl carbitol were added to 100 weight parts of silver powder and a conductor paste was prepared using a 3-piece roll.

Lamination was implemented through the printing lamination method using the printing paste A and the conductor paste to prepare a laminated body having a signal conductor with 1.5 turns, and next, 1.5 turns of a signal conductor was laminated using the printing paste B and the conductor paste. The laminated body thus achieved was cut into pieces each having dimensions of 2 mm×1.6 mm. These chips then underwent a heat treatment for 10 hours at 280° C., a thermosetting reaction was achieved between the solvent removing agent and the resin, and 3-turn chip bead elements were manufactured by applying the conductor paste to the surfaces at which the signal conductors were exposed and by hardening at 150° C. The chip bead elements each have a dimension of 2.0 mm in length and 1.2 mm in width.

Figure 37:
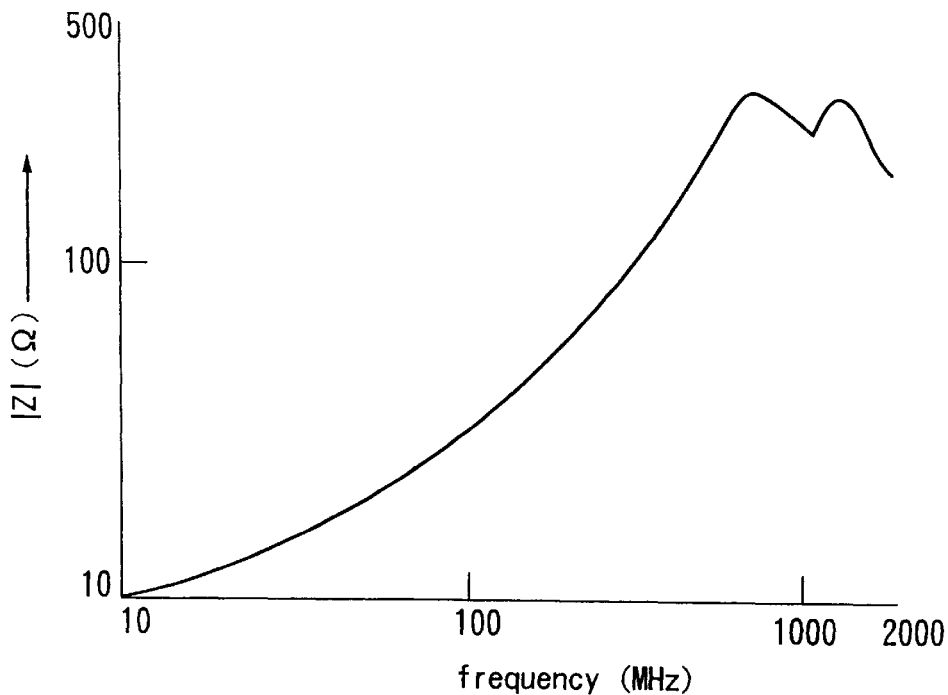
FIG. 37 presents the impedance frequency characteristics achieved in Embodiment 11.

The impedance characteristics of the chip bead elements thus obtained achieve a relatively high impedance value ranging from 100 MHz to 2 GHz, as illustrated in FIG. 37.

Embodiment 12

15 weight parts of a phenol resin and 50 weight parts of butyl carbitol were added to 100 weight parts of NiCuZn ferrite powder having a magnetic permeability of 50 and a printing paste C was prepared by using a 3-piece roll.

Lamination was implemented through the printing lamination method using the printing paste A and the conductor paste to prepare a laminated body having signal conductors with 1.5 turns, and then using the printing paste C and the conductor paste, signal conductors with 1.5 turns were laminated. Then, a laminated body with 1.5 turns was prepared on top of this assembly using the printing paste B and the conductor paste. 4. 5 turn chip bead elements were prepared from the laminated body thus achieved through the method employed in Embodiment 11. The chip bead elements also each have a dimension of 2.0 mm in length and 1.2 mm in width.

Figure 38:
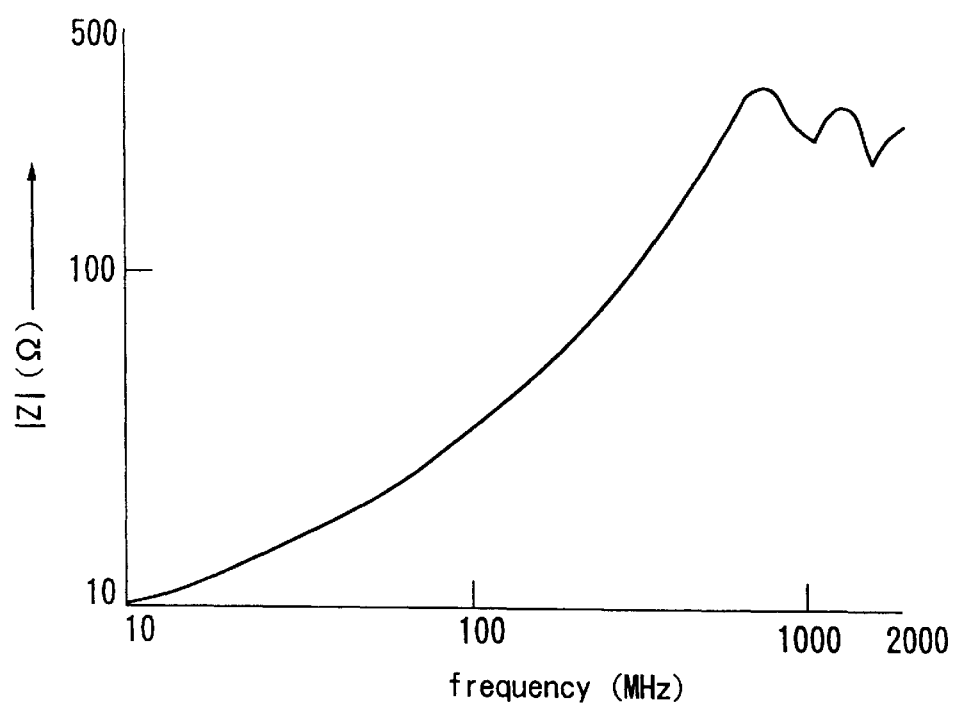
FIG. 38 presents the impedance frequency characteristics achieved in Embodiment 12.

The impedance characteristics of the chip bead element thus obtained have high impedance values even beyond 2 GHz, as shown in FIG. 38.

Example for Comparison 11

Lamination was implemented through the printing lamination method using the printing paste A and the conductor paste to prepare a laminated body having signal conductors with 1.5 turns. Then, the laminated body thus obtained was prepared into 1.5 turn chip bead elements through the method employed in Embodiment 11. The chip bead elements each have a dimension of 2.0 mm in length and 1.2 mm in width.

Figure 39:
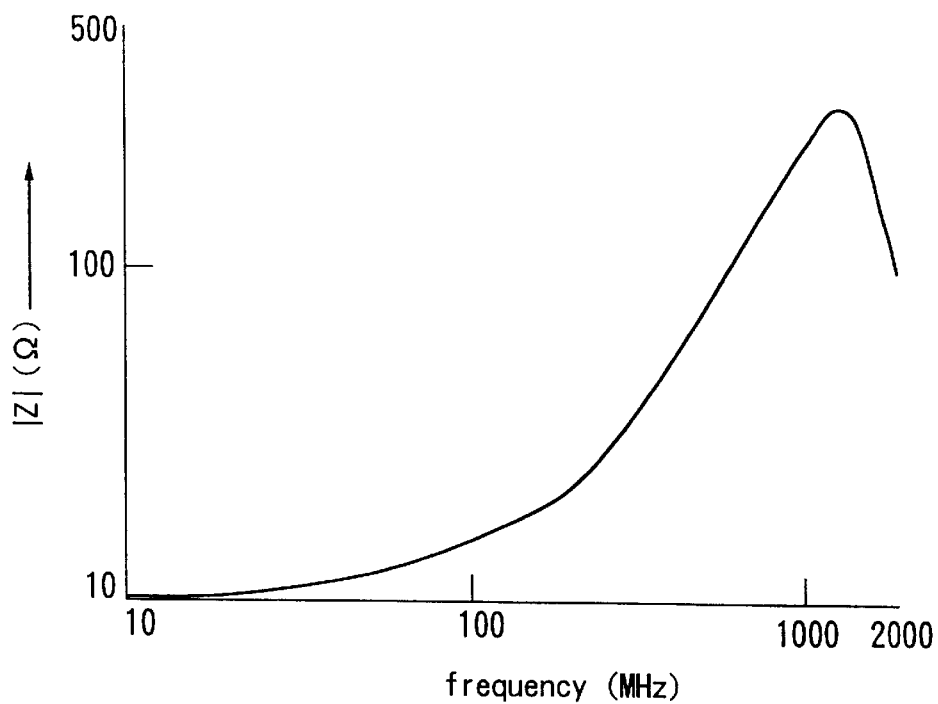
FIG. 39 presents the impedance frequency characteristics achieved in Example for Comparison 11.

The impedance characteristics of the chip bead elements thus obtained achieve a low impedance value in the low range and the impedance value is still low in the vicinity of 2 GHz as shown in FIG. 39.

Example for Comparison 12

3.8 weight parts of ethyl cellulose and 70 weight parts of butyl carbitol were added to 100 weight parts of NiCuZn ferrite powder having a magnetic permeability of 15 and a magnetic paste was prepared by kneading the mixture with a 3-piece roll. A laminated body with 1.5 turns was prepared through the printing lamination method using the magnetic paste and the conductor paste. The laminated body thus achieved was then cut into pieces of 2 mm×1.2 mm and they were baked at 870° C. for two hours in standard atmosphere. Then, terminal electrodes were coated and baked on at 600° C. to prepare chip bead elements with 1.5 turns each having a dimension of 2.0 mm in length and 1.2 mm in width.

Figure 40:
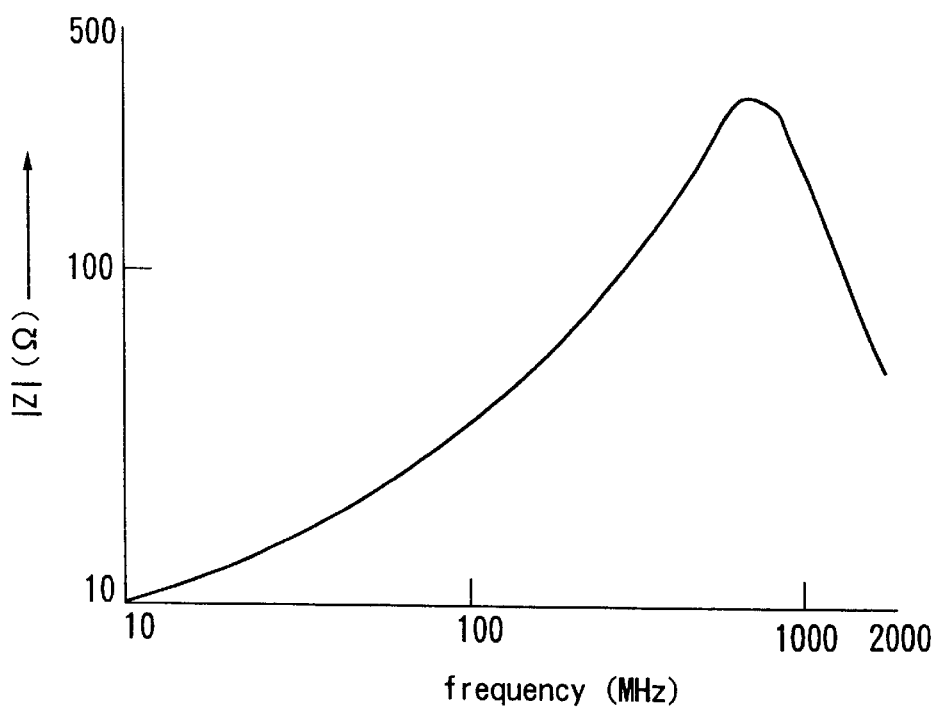
FIG. 40 presents the impedance frequency characteristics achieved in an Example for Comparison 12.

As indicated in FIG. 40, while the impedance characteristics of the chip bead element thus obtained achieve a relatively high impedance value in the low range, the value becomes drastically reduced in the high frequency range.

It is obvious that while the impedance frequency characteristics of Example for Comparison 11 employing a compound insulating body constituted of the NiCuZn ferrite material and the phenol resin are steep, Embodiment 11 employing the insulating body constituted by the compound number constituted of the MnZn ferrite powder and the phenol resin and the compound member constituted of NiCuZn ferrite and a phenol resin and Embodiment 12 constituted by laminating three different compound members, i.e., the compound member constituted of MnZn ferrite and the phenol resin, the compound member constituted of NiCuZn ferrite and the phenol resin and a compound member constituted of NiCuZn ferrite and phenol resin (the resin contents are different) demonstrate a higher impedance in a broader band.

Unlike the technology disclosed in Japanese Unexamined Patent Publication No. 78218/1996 which employs ferromagnetic metal powder, the chip bead element according to the present invention, which employs ferrite powder, utilizes the residual loss of the ferrite powder to advantage. In addition, the ferrite powder, which is a polycrystalline substance, manifests a residual loss over a broader frequency range compared to ferromagnetic metal powder. The present invention effectively utilizes these characteristics of ferrite powder.

Furthermore, there is an added advantage in that since selections can be made from a wider range of materials and compositions for the ferrite material to constitute the ferrite powder compared to a magnetic metal powder such as carbonyl iron, the electromagnetic characteristics can be designed over a broad range to accommodate specific requirements.

Moreover, when using a composite material (Japanese Unexamined Patent Publication No. 78218/1996) achieved by mixing magnetic metal powder (carbonyl iron) and resin, the surface of the carbonyl iron must undergo an oxidizing treatment to form a film with good insulating properties to assure insulation. In contrast, such a pre-treatment is not required in the present invention which employs ferrite, thereby achieving a reduction in the length of the manufacturing process.

What is claimed is:

1. A chip bead element comprising:
    an insulating body that includes a compound material achieved by mixing ferrite powder and an insulating resin; and
    at least one signal conductor embedded in said insulating body,
    wherein said ferrite powder contains one or more ferrite materials selected from the group consisting of NiCuZn ferrite, MnZn ferrite, MnMgZn ferrite and NiZn ferrite.

2. The chip bead element of claim 1 wherein said insulating body has a structure achieved by laminating a plurality of compound members.

3. The chip bead element of claim 2 wherein at least one of said plurality of compound members demonstrate electromagnetic characteristics that are different from the electromagnetic characteristics of other compound members.

4. The chip bead element of claim 1 wherein said insulating resin contains one or more resins selected from an epoxy resin, a phenol resin, an acrylic resin, a Teflon resin and a rubber resin.

5. The chip bead element of claim 1 wherein the content of said insulating resin is 5 to 90 weight % relative to the weight of said ferrite powder.

6. The chip bead element of claim 1, further provided with at least one pair of terminal electrodes, with said terminal electrodes each provided at one of two ends of said insulating body facing opposite each other and said terminal electrodes each connected to one of two ends of said signal conductor.

7. The chip bead element of claim 1 wherein said signal conductor is formed in a spiral shape.

8. The chip bead element of claim 1 wherein said signal conductor is constituted of a conductor achieved by hardening a conductor paste.

9. The chip bead element of claim 1 wherein said signal conductor is constituted of a metal foil.

10. The chip bead element of claim 7 wherein said signal conductor is wound advancing in a direction extending perpendicular to the direction in which said terminal electrodes are provided.

* * * * *